(12) United States Patent
Xu et al.

(10) Patent No.: US 10,994,389 B2
(45) Date of Patent: May 4, 2021

(54) POLISHING APPARATUS USING NEURAL NETWORK FOR MONITORING

(71) Applicant: Applied Materials, Inc., Santa Clara, CA (US)

(72) Inventors: Kun Xu, Sunol, CA (US); Hassan G. Iravani, Sunnyvale, CA (US); Denis Ivanov, St. Petersburg (RU); Boguslaw A. Swedek, Cupertino, CA (US); Shih-Haur Shen, Sunnyvale, CA (US); Harry Q. Lee, Los Altos, CA (US); Benjamin Cherian, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 394 days.

(21) Appl. No.: 15/953,203

(22) Filed: Apr. 13, 2018

(65) Prior Publication Data

US 2018/0304435 A1    Oct. 25, 2018

Related U.S. Application Data

(60) Provisional application No. 62/488,688, filed on Apr. 21, 2017.

(51) Int. Cl.
*B24B 37/013* (2012.01)
*H01L 21/306* (2006.01)
(Continued)

(52) U.S. Cl.
CPC .............. *B24B 37/013* (2013.01); *G06N 3/08* (2013.01); *G06N 3/084* (2013.01);
(Continued)

(58) Field of Classification Search
CPC ........ B24B 37/013; G06N 3/08; G06N 3/084; G06N 3/0481; H01L 21/30625; H01L 22/12; H01L 22/26
See application file for complete search history.

(56) References Cited

U.S. PATENT DOCUMENTS 5,433,651 A    7/1995 Lustig
5,559,428 A    9/1996 Li et al.
(Continued)

FOREIGN PATENT DOCUMENTS

CN    102278967    12/2011
CN    102683237    9/2012
(Continued)

OTHER PUBLICATIONS

International Search Report and Written Opinion in International Application No. PCT/US2018/0276562, dated Aug. 1, 2018, 13 pages.

*Primary Examiner* — Dung Van Nguyen
(74) *Attorney, Agent, or Firm* — Fish & Richardson P.C.

(57) ABSTRACT

A method of polishing a layer on the substrate at a polishing station includes the actions of monitoring the layer during polishing at the polishing station with an in-situ monitoring system to generate a plurality of measured signals for a plurality of different locations on the layer; generating, for each location of the plurality of different locations, an estimated measure of thickness of the location, the generating including processing the plurality of measured signals through a neural network; and at least one of detecting a polishing endpoint or modifying a polishing parameter based on each estimated measure of thickness.

20 Claims, 8 Drawing Sheets

(51) Int. Cl.
*H01L 21/66* (2006.01)
*G06N 3/08* (2006.01)
*G06N 3/04* (2006.01)

(52) U.S. Cl.
CPC ...... *H01L 21/30625* (2013.01); *G06N 3/0481* (2013.01); *H01L 22/12* (2013.01); *H01L 22/26* (2013.01)

(56) References Cited

U.S. PATENT DOCUMENTS

| | | |
|---|---|---|
| 5,644,221 A | 7/1997 | Li et al. |
| 5,660,672 A | 8/1997 | Li et al. |
| 6,004,187 A | 12/1999 | Nyui et al. |
| 6,072,313 A | 6/2000 | Li et al. |
| 6,159,073 A | 12/2000 | Wiswesser et al. |
| 6,172,756 B1 | 1/2001 | Geels et al. |
| 6,179,709 B1 | 1/2001 | Redeker et al. |
| 6,190,234 B1 | 2/2001 | Swedek et al. |
| 6,280,289 B1 | 8/2001 | Wiswesser et al. |
| 6,296,548 B1 | 10/2001 | Wiswesser et al. |
| 6,399,501 B2 | 6/2002 | Birang et al. |
| 6,407,546 B1 | 6/2002 | Le et al. |
| 6,433,541 B1 | 8/2002 | Lehman et al. |
| 6,524,165 B1 | 2/2003 | Wiswesser et al. |
| 6,558,229 B2 | 5/2003 | Kimura et al. |
| 6,594,024 B1 | 7/2003 | Singh et al. |
| 6,602,724 B2* | 8/2003 | Redeker ............... B24B 37/013 438/10 |
| 6,707,540 B1 | 3/2004 | Lehman et al. |
| 6,924,641 B1 | 8/2005 | Hanawa et al. |
| 6,945,845 B2* | 9/2005 | Bennett ............... B24B 37/013 451/41 |
| 6,975,107 B2 | 12/2005 | Hanawa et al. |
| 7,001,243 B1 | 2/2006 | Yi et al. |
| 7,008,296 B2 | 3/2006 | Swedek et al. |
| 7,025,658 B2* | 4/2006 | David ............... B24B 37/013 451/285 |
| 7,112,960 B2 | 9/2006 | Miller et al. |
| 8,106,651 B2 | 1/2012 | Lahiri et al. |
| 8,284,560 B2 | 10/2012 | Iravani et al. |
| 8,367,429 B2 | 2/2013 | Lee et al. |
| 8,408,965 B2* | 4/2013 | Bennett ............... G01B 7/105 451/5 |
| 9,281,253 B2* | 3/2016 | Xu ............... B24B 49/105 |
| 10,478,937 B2* | 11/2019 | Tang ............... B24B 49/003 |
| 2001/0008827 A1 | 7/2001 | Kimura et al. |
| 2002/0002029 A1 | 1/2002 | Kimura et al. |
| 2002/0013007 A1 | 1/2002 | Hasegawa et al. |
| 2002/0013124 A1 | 1/2002 | Tsujimura et al. |
| 2002/0055192 A1 | 5/2002 | Bajaj et al. |
| 2002/0077031 A1 | 6/2002 | Johansson et al. |
| 2002/0098777 A1 | 7/2002 | Laursen et al. |
| 2002/0155789 A1 | 10/2002 | Adams et al. |
| 2003/0028279 A1 | 2/2003 | Wang et al. |
| 2003/0053042 A1 | 3/2003 | Chen |
| 2003/0087459 A1 | 5/2003 | Laursen et al. |
| 2004/0259470 A1 | 12/2004 | Swedek et al. |
| 2005/0024047 A1* | 2/2005 | Miller ............... H01L 21/67253 324/231 |
| 2006/0009132 A1 | 1/2006 | Bennett et al. |
| 2009/0104847 A1 | 4/2009 | Kobayashi et al. |
| 2010/0099334 A1 | 4/2010 | Bennett et al. |
| 2011/0189925 A1 | 8/2011 | Iravani et al. |
| 2012/0276661 A1 | 11/2012 | Iravani et al. |
| 2013/0000845 A1 | 1/2013 | Lu et al. |
| 2015/0118765 A1 | 4/2015 | Xu et al. |
| 2015/0371907 A1 | 12/2015 | Lu et al. |
| 2015/0371913 A1* | 12/2015 | Lu ............... H01L 21/3212 438/11 |
| 2018/0056476 A1 | 3/2018 | Zhang et al. |
| 2018/0203089 A1 | 7/2018 | Xu et al. |
| 2019/0299356 A1 | 10/2019 | Xu et al. |

FOREIGN PATENT DOCUMENTS

| | | |
|---|---|---|
| EP | 1063056 | 12/2000 |
| JP | 2009-099842 | 5/2009 |
| KR | 10-2016-0052216 | 6/2016 |
| KR | 10-2017-0015406 | 2/2017 |

* cited by examiner

POLISHING APPARATUS USING NEURAL NETWORK FOR MONITORING

CROSS-REFERENCE TO RELATED APPLICATIONS

This application claims priority to U.S. Application Ser. No. 62/488,688, filed on Apr. 21, 2017, the disclosure of which is incorporated by reference.

TECHNICAL FIELD

The present disclosure relates to in-situ monitoring during polishing of a substrate.

BACKGROUND

An integrated circuit is typically formed on a substrate (e.g. a semiconductor wafer) by the sequential deposition of conductive, semiconductive or insulative layers on a silicon wafer, and by the subsequent processing of the layers.

One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be used to planarize the substrate surface for lithography.

Chemical mechanical polishing (CMP) is one accepted method of planarization. This planarization method typically requires that the substrate be mounted on a carrier head. The exposed surface of the substrate is placed against a rotating polishing pad. The carrier head provides a controllable load on the substrate to push it against the polishing pad. A polishing liquid, such as slurry with abrasive particles, is supplied to the surface of the polishing pad.

During semiconductor processing, it may be important to determine one or more characteristics of the substrate or layers on the substrate. For example, it may be important to know the thickness of a conductive layer during a CMP process, so that the process may be terminated at the correct time. A number of methods may be used to determine substrate characteristics. For example, optical sensors may be used for in-situ monitoring of a substrate during chemical mechanical polishing. Alternately (or in addition), an eddy current sensing system may be used to induce eddy currents in a conductive region on the substrate to determine parameters such as the local thickness of the conductive region.

SUMMARY

In one aspect, a method of polishing a layer on the substrate at a polishing station includes monitoring the layer during polishing at the polishing station with an in-situ monitoring system to generate a plurality of measured signals for a plurality of different locations on the layer, generating, for each location of the plurality of different locations, an estimated measure of thickness of the location, the generating including processing the plurality of measured signals through a neural network, and at least one of detecting a polishing endpoint or modifying a polishing parameter based on each estimated measure of thickness.

In another aspect, corresponding computer systems, apparatus, and computer programs recorded on one or more computer storage devices, are configured to perform the method. A system of one or more computers can be configured to perform particular operations or actions by virtue of software, firmware, hardware, or any combination thereof installed on the system that in operation may cause the system to perform the actions. One or more computer programs can be configured to perform particular operations or actions by virtue of including instructions that, when executed by data processing apparatus, cause the apparatus to perform the actions.

In another aspect, a polishing system includes a carrier to hold a substrate, a support for a polishing surface, an in-situ monitoring system having a sensor, a motor to generate relative motion between the sensor and the substrate, and a controller. The in-situ monitoring system is configured to generate measured signals for a plurality of different locations on the layer. The controller is configured to receive the plurality of measured signals from the in-situ monitoring system, generate, for each location of the plurality of different locations, an estimated measure of thickness of the location, the generating including processing the plurality of measured signals through a neural network, and detect a polishing endpoint, modify a polishing parameter based on each estimated measure of thickness, or both.

Implementations of any of the above aspects may include one or more of the following features.

A second plurality of measured signals may be obtained for a second plurality of different locations on the layer. For each location of the second plurality of different locations, an estimated measure of thickness of the location may be generated based on the measured signal for the location. Generating the estimated measure of thickness may include using a static formula relating multiple values of the measured signals to multiple values of estimated measure of thickness. A third plurality of measured signals may be obtained for a layer on a second substrate. Each of the third plurality of measured signals may correspond to a location of a third plurality of locations on the layer on the second substrate. For each location of the third plurality of different locations, an estimated measure of thickness of the location may be generated based on the measured signal for the location. Generating the estimated measure of thickness may include using a static formula relating multiple values of the measured signals to multiple values of estimated measure of thickness.

The in-situ monitoring system may include an eddy current sensor. The neural network may include one or more neural network layers including an input layer, an output layer, and one or more hidden layers; each neural network layer may include one or more neural network nodes. Each neural network node may be configured to process an input in accordance with a set of parameters to generate an output. The input to a neural network node in the input layer may include a measure of the wear of a pad of the polishing station. The one or more different locations may include an anchor location and determining each first measure of thickness may include normalizing each measured signal based on the measured signal for the anchor location to update the measured signal. The anchor location may be spaced away from an edge of the substrate. Each estimated measure of thickness may be a normalized value and the method may further include the action of converting each estimated measure of thickness to a non-normalized value using the measured signal for the anchor location to update the estimated measure of thickness.

A ground truth measure of thickness may be obtained for each location of one or more different locations of the layer. A measure of error between the estimated measure thickness for each location and the corresponding ground truth measures of thickness for the location may be computed. The parameters of the neural network system may be updated based on the measure of error. The ground truth measure of thickness may be determined based on a four-points probes method. Updating the parameters of the neural network system based on the measure of error may include back-propagating a gradient of the measure of error through a plurality of layers of the neural network.

Certain implementations can include one or more of the following advantages. An in-situ monitoring system, e.g., an eddy current monitoring system, can generate a signal as a sensor scans across the substrate. The system can compensate for distortions in a portion of the signal that corresponds to the substrate edge. The signal can be used for endpoint control and/or closed-loop control of polishing parameters, e.g., carrier head pressure, thus providing improved within-wafer non-uniformity (WIWNU) and water-to-wafer non-uniformity (WTWNU).

The details of one or more implementations are set forth in the accompanying drawings and the description below. Other aspects, features and advantages will be apparent from the description and drawings, and from the claims.

BRIEF DESCRIPTION OF DRAWINGS

Like reference symbols in the various drawings indicate like elements.

DETAILED DESCRIPTION

A polishing apparatus can use an in-situ monitoring system, e.g., an eddy current monitoring system, to detect the thickness of an outer layer that is being polished on a substrate. During polishing of the outer layer, the in-situ monitoring system can determine the thickness of different locations of the layer on the substrate. The thickness measurements can be used to trigger a polishing endpoint and/or to adjust processing parameters of the polishing process in real time. For example, a substrate carrier head can adjust the pressure on the backside of the substrate to increase or decrease the polishing rate of the locations of the outer layer. The polishing rate can be adjusted so that the locations of the layer are substantially the same thickness after polishing.

The CMP system can adjust the polishing rate so that polishing of the locations of the layer completes at about the same time. Such profile control can be referred to as real time profile control (RTPC).

An in-situ monitoring system can be subject to signal distortion for measurements at locations close to the substrate edge. For example, an eddy current monitoring system can generate a magnetic field. Near the substrate edge, the signal can be artificially low because the magnetic field only partially overlaps the conductive layer of the substrate. However, if the polishing apparatus uses a neural network to generate modified signals based on the measured signals generated by the in-situ monitoring system, the apparatus can compensate for the distortions, e.g., reduced signal strength, at the substrate edge.

Figure 1A:
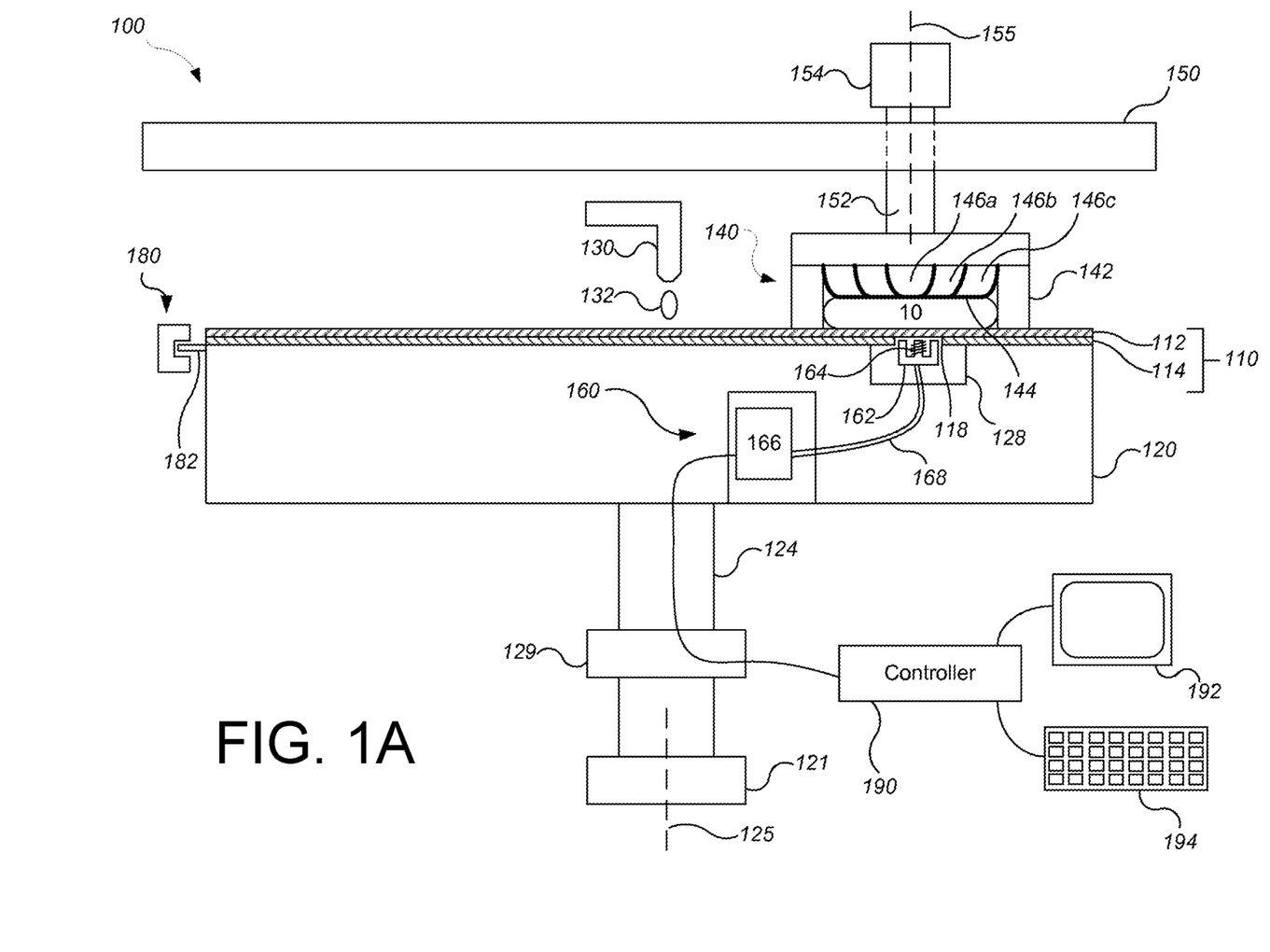
FIG. 1A is a schematic side view, partially cross-sectional, of a chemical mechanical polishing station that includes an eddy current monitoring system.
Figure 1B:
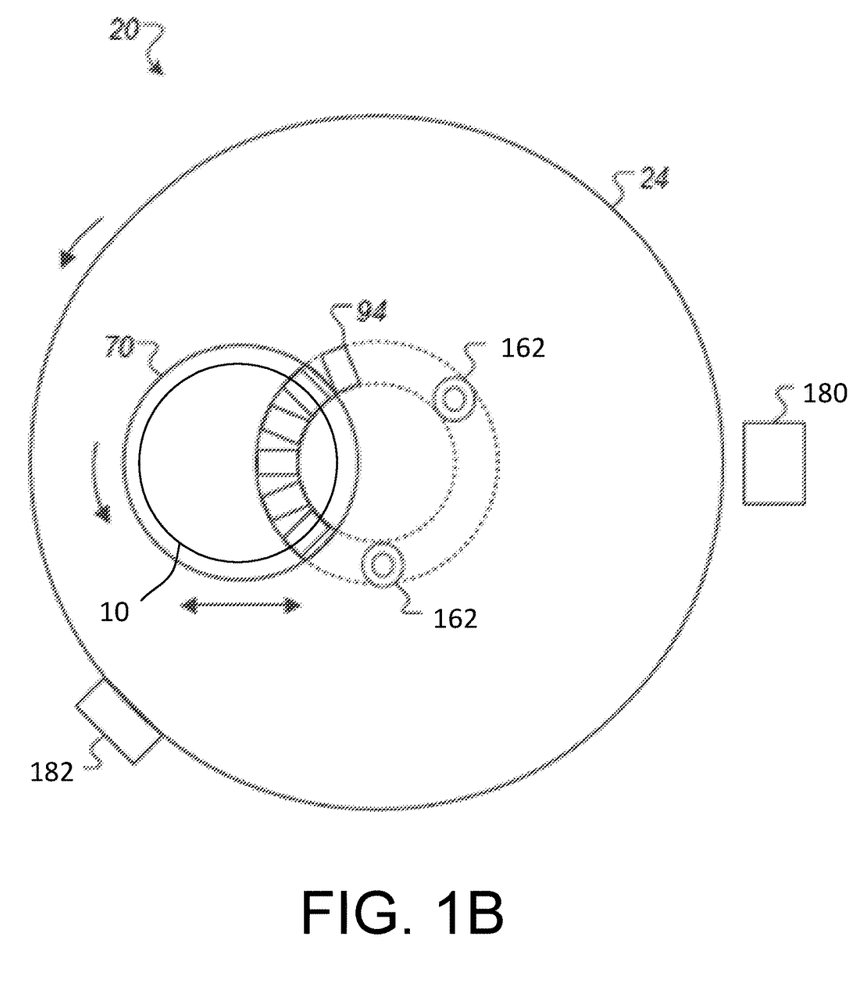
FIG. 1B is a schematic top view of a chemical mechanical polishing station.

FIGS. 1A and 1B illustrate an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 100 can include a port 130 to dispense polishing liquid 132, such as slurry, onto the polishing pad 110. The polishing apparatus can also include a polishing pad conditioner to abrade the polishing pad 110 to maintain the polishing pad 110 in a consistent abrasive state.

The polishing apparatus 100 includes at least one carrier head 140. The carrier head 140 is operable to hold a substrate 10 against the polishing pad 110. The carrier head 140 can have independent control of the polishing parameters, for example pressure, associated with each respective substrate.

In particular, the carrier head 140 can include a retaining ring 142 to retain the substrate 10 below a flexible membrane 144. The carrier head 140 also includes a plurality of independently controllable pressurizable chambers defined by the membrane, e.g., three chambers 146a-146c, which can apply independently controllable pressures to associated zones on the flexible membrane 144 and thus on the substrate 10. Although only three chambers are illustrated in FIG. 1 for ease of illustration, there could be one or two chambers, or four or more chambers, e.g., five chambers.

The carrier head 140 is suspended from a support structure 150, e.g., a carousel or a track, and is connected by a drive shaft 152 to a carrier head rotation motor 154 so that the carrier head can rotate about an axis 155. Optionally the carrier head 140 can oscillate laterally, e.g., on sliders on the carousel 150 or track; or by rotational oscillation of the carousel itself. In operation, the platen is rotated about its central axis 125, and the carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently.

The polishing apparatus 100 also includes an in-situ monitoring system 160. The in-situ monitoring system 160 generates a time-varying sequence of values that depend on the thickness of a layer on the substrate. The in-situ monitoring system 160 includes a sensor head at which the measurements are generated; due to relative motion between the substrate and the sensor head, measurements will be taken at different locations on the substrate.

The in-situ-monitoring system 160 can be an eddy current monitoring system. The eddy current monitoring system 160 includes a drive system to induce eddy currents in a conductive layer on the substrate and a sensing system to detect eddy currents induced in the conductive layer by the drive system. The monitoring system 160 includes a core 162 positioned in a recess 128 to rotate with the platen, at least one coil 164 wound around a portion of the core 162, and drive and sense circuitry 166 connected by wiring 168 to the coil 164. The combination of the core 162 and coil 164 can provide the sensor head. In some implementations, the core 162 projects above the top surface of the platen 120, e.g., into a recess 118 in the bottom of the polishing pad 110.

The drive and sense circuitry 166 is configured to apply an oscillating electric signal to the coil 164 and to measure the resulting eddy current. A variety of configurations are possible for the drive and sense circuitry and for the configuration and position of the coil(s), e.g., as described in U.S. Pat. Nos. 6,924,641, 7,112,960 and 8,284,560, and in U.S. Patent Publication Nos. 2011-0189925 and 2012-0276661. The drive and sense circuitry 166 can be located in the same recess 128 or a different portion of the platen 120, or could be located outside the platen 120 and be coupled to the components in the platen through a rotary electrical union 129.

In operation the drive and sense circuitry 166 drives the coil 164 to generate an oscillating magnetic field. At least a portion of magnetic field extends through the polishing pad 110 and into substrate 10. If a conductive layer is present on substrate 10, the oscillating magnetic field generates eddy currents in the conductive layer. The eddy currents cause the conductive layer to act as an impedance source that is coupled to the drive and sense circuitry 166. As the thickness of the conductive layer changes, the impedance changes, and this can be detected by the drive and sense circuitry 166.

Alternatively or in addition, an optical monitoring system, which can function as a reflectometer or interferometer, can be secured to the platen 120 in the recess 128. If both systems are used, the optical monitoring system and eddy current monitoring system can monitor the same portion of the substrate.

The CMP apparatus 100 can also include a position sensor 180, such as an optical interrupter, to sense when the core 162 is beneath the substrate 10. For example, the optical interrupter could be mounted at a fixed point opposite the carrier head 140. A flag 182 is attached to the periphery of the platen. The point of attachment and length of flag 182 is selected so that it interrupts the optical signal of sensor 180 while the core 162 sweeps beneath substrate 10. Alternatively or in addition, the CMP apparatus can include an encoder to determine the angular position of platen.

A controller 190, such as a general purpose programmable digital computer, receives the intensity signals from the eddy current monitoring system 160. The controller 190 can include a processor, memory, and I/O devices, as well as an output device 192 e.g., a monitor, and an input device 194, e.g., a keyboard.

The signals can pass from the eddy current monitoring system 160 to the controller 190 through the rotary electrical union 129. Alternatively, the circuitry 166 could communicate with the controller 190 by a wireless signal.

Since the core 162 sweeps beneath the substrate with each rotation of the platen, information on the conductive layer thickness is accumulated in-situ and on a continuous real-time basis (once per platen rotation). The controller 190 can be programmed to sample measurements from the monitoring system when the substrate generally overlies the core 162 (as determined by the position sensor). As polishing progresses, the thickness of the conductive layer changes, and the sampled signals vary with time. The time varying sampled signals may be referred to as traces. The measurements from the monitoring systems can be displayed on the output device 192 during polishing to permit the operator of the device to visually monitor the progress of the polishing operation.

In operation, the CMP apparatus 100 can use the eddy current monitoring system 160 to determine when the bulk of the filler layer has been removed and/or to determine when the underlying stop layer has been substantially exposed. Possible process control and endpoint criteria for the detector logic include local minima or maxima, changes in slope, threshold values in amplitude or slope, or combinations thereof.

The controller 190 may also be connected to the pressure mechanisms that control the pressure applied by carrier head 140, to carrier head rotation motor 154 to control the carrier head rotation rate, to the platen rotation motor 121 to control the platen rotation rate, or to slurry distribution system 130 to control the slurry composition supplied to the polishing pad. In addition, the computer 190 can be programmed to divide the measurements from the eddy current monitoring system 160 from each sweep beneath the substrate into a plurality of sampling zones, to calculate the radial position of each sampling zone, and to sort the amplitude measurements into radial ranges, as discussed in U.S. Pat. No. 6,399,501. After sorting the measurements into radial ranges, information on the film thickness can be fed in real-time into a closed-loop controller to periodically or continuously modify the polishing pressure profile applied by a carrier head in order to provide improved polishing uniformity.

Figure 3:
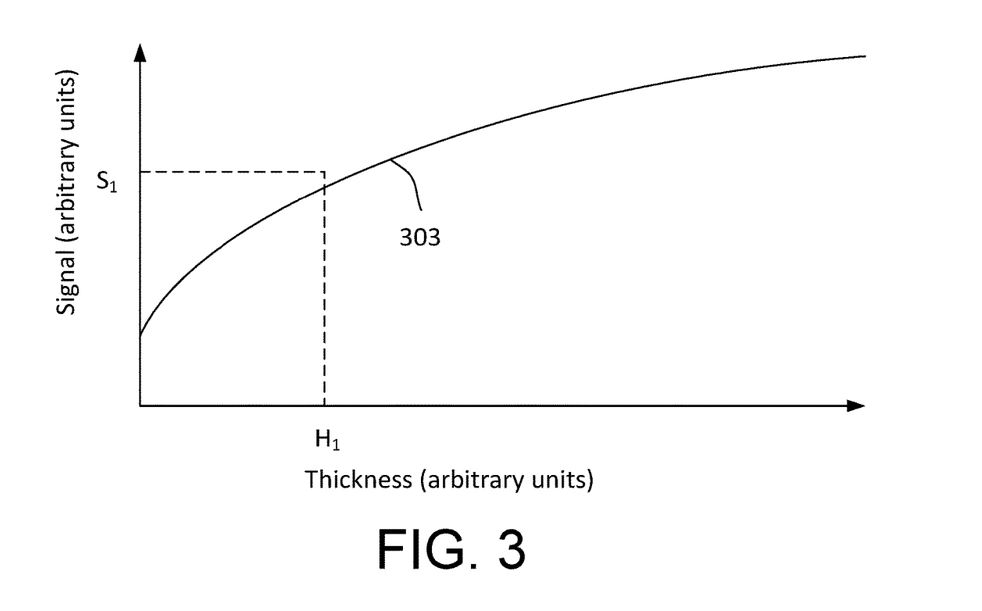
FIG. 3 is a schematic graph of a static formula for determining substrate thickness based on measured signals.

The controller 190 can use a correlation curve that relates the signal measured by the in-situ monitoring system 160 to the thickness of the layer being polished on the substrate 10 to generate an estimated measure of the thickness of the layer being polished. An example of a correlation curve 303 is shown in FIG. 3. In the coordinate system depicted in FIG. 3, the horizontal axis represents the value of the signal received from the in-situ monitoring system 160, whereas the vertical axis represents the value for the thickness of the layer of the substrate 10. For a given signal value, the controller 190 can use the correlation curve 303 to generate a corresponding thickness value. The correlation curve 303 can be considered a "static" formula, in that it predicts a thickness value for each signal value regardless of the time or position at which the sensor head obtained the signal. The correlation curve can be represented by a variety of functions, such as a polynomial function, or a look-up table (LUT) combined with linear interpolation.

Figure 2:
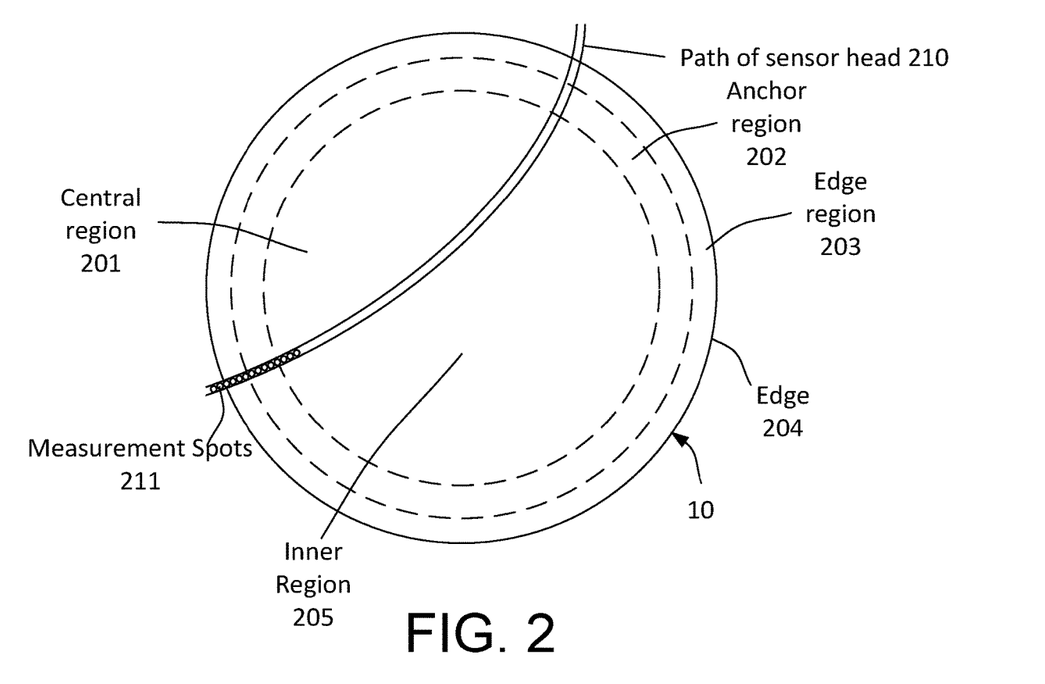
FIG. 2 is a schematic top view of a substrate being scanned by a sensor head of a polishing apparatus.

Referring to FIGS. 1B and 2, changes in the position of the sensor head with respect to the substrate 10 can result in a change in the signal from the in-situ monitoring system 160. That is, as the sensor head scans across the substrate 10, the in-situ monitoring system 160 will make measurements for multiple regions 94, e.g., measurement spots, at different locations on the substrate 10. The regions 94 can be partially overlapping (see FIG. 2).

Figure 4:
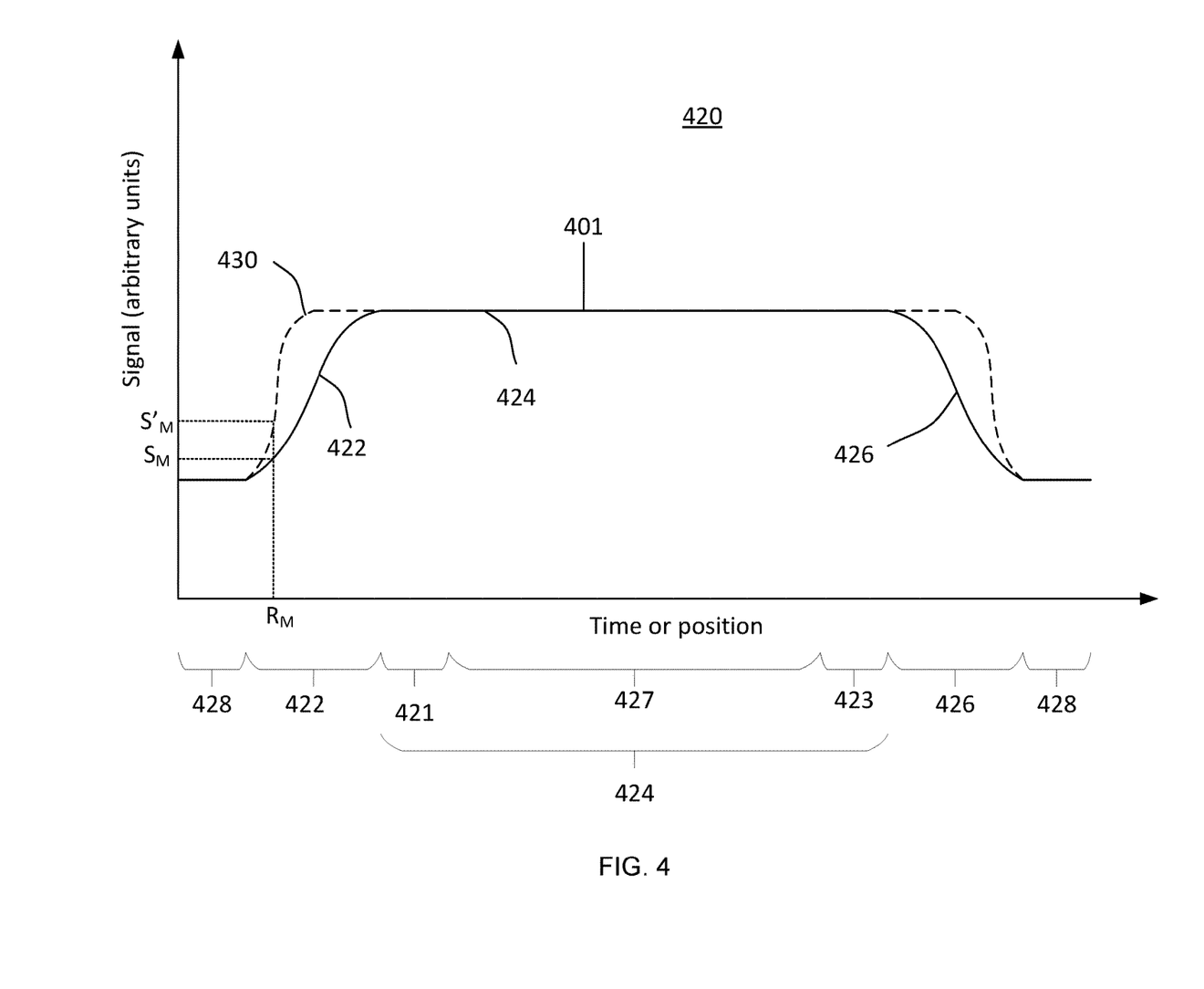
FIG. 4 is a schematic graph of measured signals obtained while monitoring locations on a substrate.

FIG. 4 illustrates a graph 420 that shows a signal 401 from the in-situ monitoring system 160 during a single pass of the sensor head below the substrate 10. The signal 401 is composed of a series of individual measurements from the sensor head as it sweeps below the substrate. The graph 420 can be a function of measurement time or of position, e.g., radial position, of the measurement on the substrate. In either case, different portions of the signal 401 correspond to measurement spots 94 at different locations on the substrate 10 scanned by the sensor head. Thus, the graph 420 depicts, for a given location of the substrate scanned by the sensor head, a corresponding measured signal value from the signal 401.

Referring to FIGS. 2 and 4, the signal 401 includes a first portion 422 that corresponds to locations in an edge region 203 of the substrate 10 when the sensor head crosses a leading edge of the substrate 10, a second portion 424 that corresponds to locations in a central region 201 of the substrate 10, and a third portion 426 that corresponds to locations in edge region 203 when the sensor head crosses a trailing edge of the substrate 10. The signal can also include portions 428 that correspond to off-substrate measurements, i.e., signals generated when the sensor head scans areas beyond the edge 204 of the substrate 10 in FIG. 2.

The edge region 203 can correspond to a portion of the substrate where measurement spots 94 of the sensor head overlap the substrate edge 204. The central region 201 can include an annular anchor region 202 that is adjacent the edge region 203, and an inner region 205 that is surrounded by the anchor region 202. The sensor head may scan these regions on its path 210 and generate a sequence of measurements that correspond to a sequence of locations along the path 210.

In the first portion 422, the signal intensity ramps up from an initial intensity (typically the signal resulting when no substrate and no carrier head is present) to a higher intensity. This is caused by the transition of the monitoring location from initially only slightly overlapping the substrate at the edge 204 of the substrate (generating the initial lower values) to the monitoring location nearly entirely overlapping the substrate (generating the higher values). Similarly, in the third portion 426, the signal intensity ramps down when the monitoring location transitions to the edge 204 of the substrate.

Although the second portion 424 is illustrated as flat, this is for simplicity, and a real signal in the second portion 424 would likely include fluctuations due both to noise and to variations in the layer thickness. The second portion 424 corresponds to the monitoring location scanning the central region 201. The second portion 424 includes sub-portions 421 and 423 that are caused by the monitoring location scanning the anchor region 202 of the central region 201 and sub-portion 427 that is caused by the monitoring location scanning the inner region 205 of the central region 201.

As noted above, the variation in the signal intensity in the regions 422, 426 is caused in part by measurement region of the sensor overlapping the substrate edge, rather than an intrinsic variation in the thickness or conductivity of the layer being monitored. Consequently, this distortion in the signal 401 can cause errors in the calculating of a characterizing value for the substrate, e.g., the thickness of the layer, near the substrate edge. To address this problem, the controller 190 can include a neural network, e.g., neural network 500 of FIG. 5, to generate a modified signal corresponding to one or more locations of the substrate 10 based on the measured signals corresponding to those locations.

Figure 5:
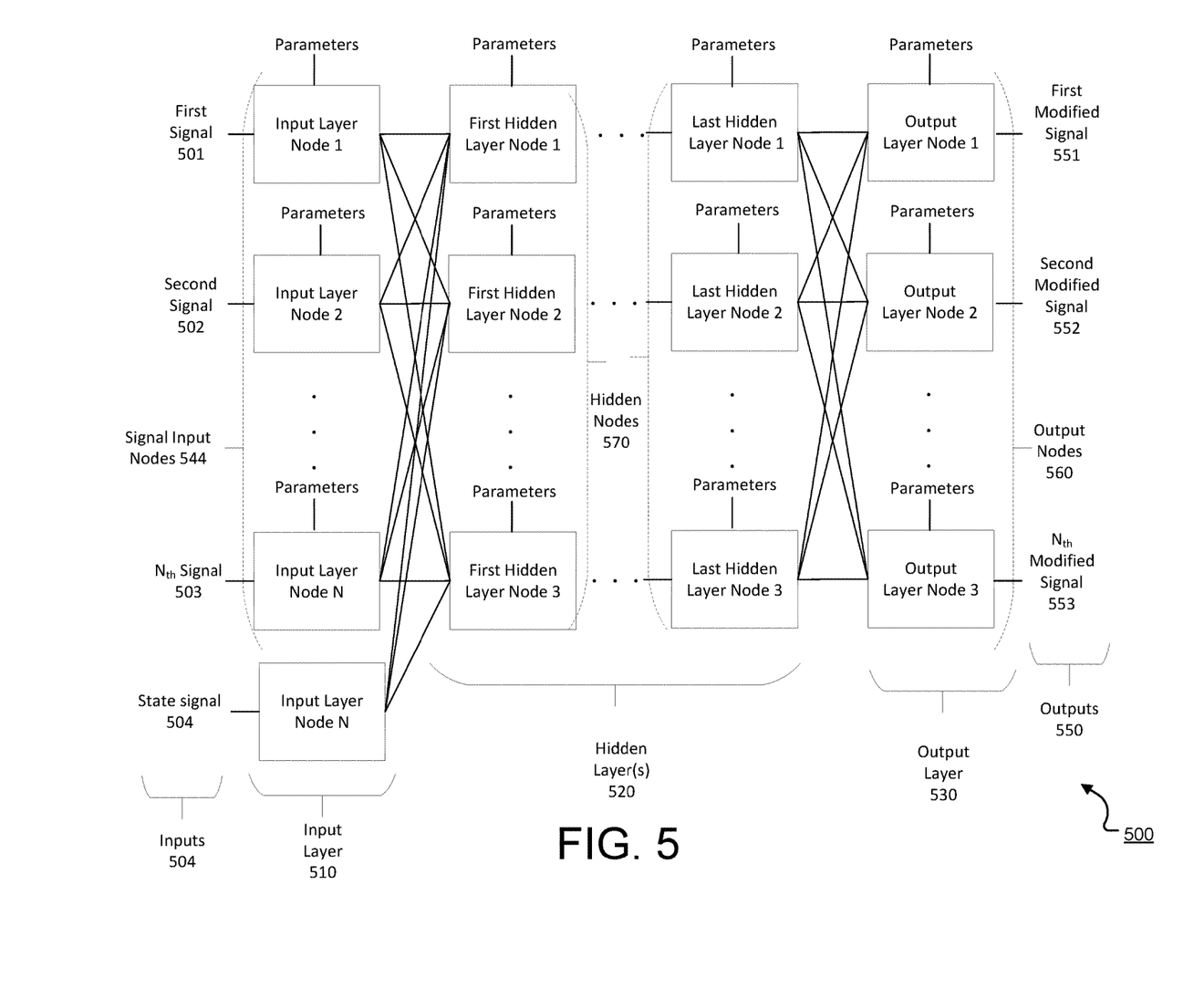
FIG. 5 is an example neural network.

Referring now to FIG. 5, the neural network 500 is configured to, when trained appropriately, generate modified signals that reduce and/or remove the distortion of computed signal values near the substrate edge. The neural network 500 receives a group of inputs 504 and processes the inputs 504 through one or more neural network layers to generate a group of outputs 550. The layers of the neural network 500 include an input layer 510, an output layer 530, and one or more hidden layers 520.

Each layer of the neural network 500 includes one or more neural network nodes. Each neural network node in a neural network layer receives one or more node input values (from the inputs 504 to the neural network 500 or from the output of one or more nodes of a preceding neural network layer), processes the node input values in accordance with one or more parameter values to generate an activation value, and optionally applies a non-linear transformation function (e.g., a sigmoid or tan h function) to the activation value to generate an output for the neural network node.

Each node in the input layer 510 receives as a node input value one of the inputs 504 to the neural network 500.

The inputs 504 to the neural network include measured signal values from the in-situ monitoring system 160 for multiple different locations on the substrate 10, such as a first measured signal value 501, a second measured signal value 502, through an nth measured signal value 503. The measured signal values can be individual values of the sequence of values in the signal 401.

In general, the multiple different locations include locations in the edge region 203 and the anchor region 202 of the substrate 10. In some implementations, the multiple different locations are only in the edge region 203 and the anchor region 202. In other implementations, the multiple different locations span all regions of the substrate.

These measured signal values are received at signal input nodes 544. Optionally, the input nodes 504 of the neural network 500 can also include one or more state input nodes 516 that receive one or more process state signals 504, e.g., a measure of wear of the pad 110 of the polishing apparatus 100.

The nodes of the hidden layers 520 and output layer 530 are illustrated as receiving inputs from every node of a preceding layer. This is the case in a fully-connected, feedforward neural network. However, the neural network 500 may be a non-fully-connected feedforward neural network or a non-feedforward neural network. Moreover, the neural network 500 may include at least one of one or more fully-connected, feedforward layers; one or more non-fully-connected feedforward layers; and one or more non-feedforward layers.

The neural network generates a group of modified signal values 550 at the nodes of the output layer 530, i.e., "output nodes" 550. In some implementations, there is an output node 550 for each measured signal from the in-situ monitoring system that is fed to the neural network 500. In this case, the number of output nodes 550 can correspond to the number of signal input nodes 504 of the input layer 510.

For example, the number of signal input nodes 544 can equal the number of measurements in the edge region 203 and the anchor region 202, and there can be an equal number of output nodes 550. Thus, each output node 550 generates a modified signal that corresponds to a respective measured signal supplied as an input to a signal input node 544, e.g., the first modified signal 551 for the first measured signal 501, the second modified signal 5552 for the second measured signal 502, and the nth modified signal 553 for the nth measured signal 503.

In some implementations, the number of output nodes 550 is smaller than the number of input nodes 504. In some implementations, the number of output nodes 550 is smaller than the number of signal input nodes 544. For example, the number of signal input nodes 544 can equal the number of measurements in the edge region 203, or equal to the number of measurements in the edge region 203 and anchor region 202. Again, each output node 550 of the output layer 530 generates a modified signal that corresponds to a respective measured signal supplied as a signal input node 504, e.g., the first modified signal 551 for the first measured signal 501, but only for the signal input nodes 554 that receive signals from the edge region 203.

The polishing apparatus 100 can use the neural network 500 to generate modified signals. The modified signals can then be used to determine a thickness for each location in a first group of locations of a substrate, e.g., the locations in the edge region (and possibly the anchor region). For example, referring back to FIG. 4, the modified signal values for the edge region can provide a modified portion 430 of the signal 401.

The modified signals values 430 can be converted to thickness measurements using a static formula, e.g., the correlation curve. For example, the controller 190 can use the neural network 500 to determine a thickness of an edge location and one or more anchor locations of the substrate. In contrast, the controller 190 can generate thickness measurements for other regions, e.g., the inner region 205, directly using the static formula. That is, signal values from other regions, e.g., the inner region 205, can be converted to thickness values without having been modified by the neural network.

In some implementations, for a modified signal value that corresponds to a given measurement location, the neural network 500 can be configured such that only input signal values from measurement locations within a predetermined distance of that given location are used in determining the modified signal value. For example, if signal values $S_1$, $S_2$, ..., $S_M$, ... $S_N$ are received, corresponding to measurements at N successive locations on the path 210, a modified signal value $S'_M$ for the Mth location (indicate at $R_M$) can use only the signal values $S_{M-L\ (min\ 1)}, \ldots S_M, \ldots S_{M+L\ (max\ N)}$ to calculate the modified signal value $S'_M$. The value of L can be selected such that measurements that are up to about 2-4 mm apart are used to generate a given modified signal value $S'_M$; measurements within about 1-2 mm, e.g., 1.5 mm, of the location of the measurement $S_M$ can be used. For example, L can be a number from the range 0 to 4, e.g., 1 or 2. For example, if measurements within 3 mm are used, and the spacing between measurements is 1 mm, then L can be 1; if the spacing is 0.5 mm, then L can be 2; if the spacing is 0.25 then L can be 4. However, this can depend on the configuration of the polishing apparatus and the processing conditions. Values of other parameters, e.g., pad wear, could still be used in calculating the modified signal value $S'_M$.

For example, there can be a number of hidden nodes 570 of the one or more hidden layers 520, i.e., "hidden nodes" 570, equal to the number of signal input nodes 544, with each hidden node 570 corresponding to a respective signal input node 544. Each hidden node 570 can be disconnected from (or have a parameter value of zero for) input nodes 544 that correspond to measurements for locations greater than the predetermined distance from the location of the measurement of the corresponding input node. For example, the $M^{th}$ hidden node can be disconnected from (or have a parameter value of zero for) the $1^{st}$ through $(M-L-1)^{th}$ input nodes 544 and the $(M+L+1)^{th}$ through $N^{th}$ input nodes. Similarly, each output node 560 can be disconnected from (or have a parameter value of zero for) hidden nodes 570 that correspond to the modified signals for locations that are greater than the predetermined distance from the location of the measurement of the output node. For example, the $M^{th}$ output node can be disconnected from (or have a parameter value of zero for) the $1^{st}$ through $(M-L-1)^{th}$ hidden nodes 570 and the $(M+L+1)^{th}$ through $N^{th}$ hidden nodes.

In some embodiments, the polishing apparatus 100 can use the static formula to determine a thickness of multiple locations, e.g., locations within the edge region, of a first group of substrates. These substrates can be used to generate training data that is used to train the neural network. Then the polishing apparatus 100 can use the neural network 500 to generate modified signals used to determine a thickness of multiple locations, e.g., locations within the edge region of a second group of substrates. For example, the polishing apparatus 100 can apply the static formula to determine thickness values for the first group of substrates, and use the trained neural network 500 to generate modified signals used to determine thickness values for the second group of substrates.

Figure 6:
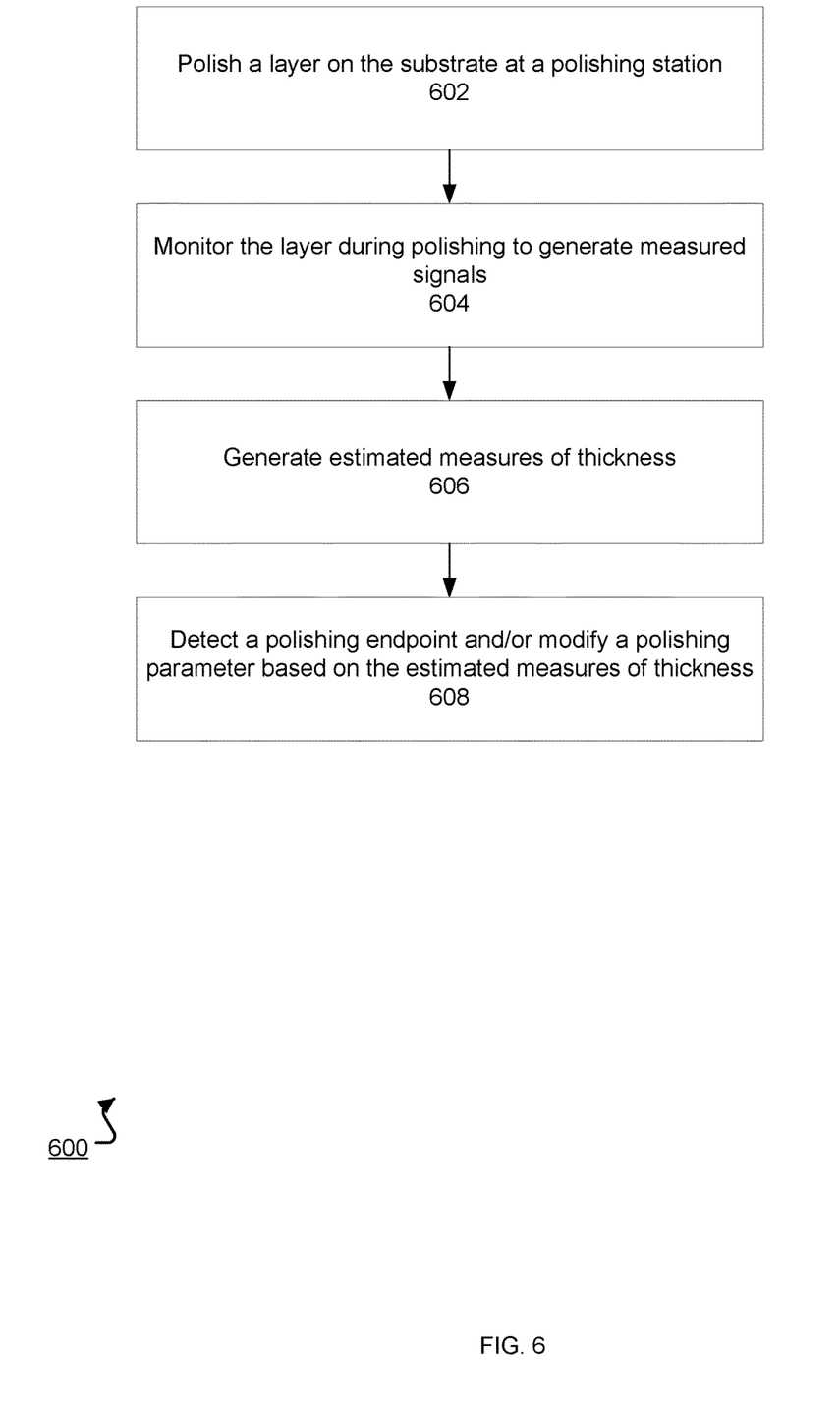
FIG. 6 is a flow diagram of an example process for polishing a substrate.

FIG. 6 is a flow-diagram of an example process 600 for polishing a substrate 10. The process 600 can be performed by the polishing apparatus 100.

The polishing apparatus 100 polishes (602) a layer on the substrate 10 and monitors (604) the layer during the polishing to generate measured signal values for different locations on the layer. The locations on the layer can include one or more locations within the edge region 203 of the substrate (corresponding to the regions 422/426 of the signal 401), and one or more locations within an anchor region 202 on the substrate (corresponding to regions 421/423 of the signal). The anchor region 202 is spaced away from the substrate edge 204 and within a central region 201 of the substrate, and thus is not affected by the distortion created by the substrate edge 204. However, the anchor region 202 can be adjacent to the edge region 203. The anchor region 202 can also surround the inner region 205 of the central region 201. The number of anchor locations can depend on the measurement spot size and measurement frequency by the in-situ monitoring system 160. In some embodiments, the number of the anchor locations cannot exceed a maximum value, such as a maximum value of 4.

The polishing apparatus 100 generates (606) an estimated measure of thickness for each location of the different locations based on the measured signal for the location. This includes processing the measured signals through the neural network 500.

The inputs to the neural network 500 may be raw measured signals generated by the in-situ monitoring system 160 for the different locations or updated measured signals. In some embodiments, the apparatus 100 updates each measured signal by normalizing the value of the signals. Such normalization can increase the likelihood that at least some of the inputs 504 to the neural network system 500 fall within a particular range, which in turn can increase the quality of training of the neural network and/or the accuracy of the inference made by the neural network 500.

The outputs of the neural network 500 are modified signals each corresponding to an input measured signal. If the measured signals are normalized values, the modified signals corresponding to the measured signals will also be normalized values. Therefore, the polishing apparatus 100 may need to convert such modified signals to non-normalized values before using modified signals to estimate thickness of substrate.

The polishing apparatus 100 detects (608) a polishing endpoint and/or modify a polishing parameter based on each estimated measures of thickness.

Figure 7:
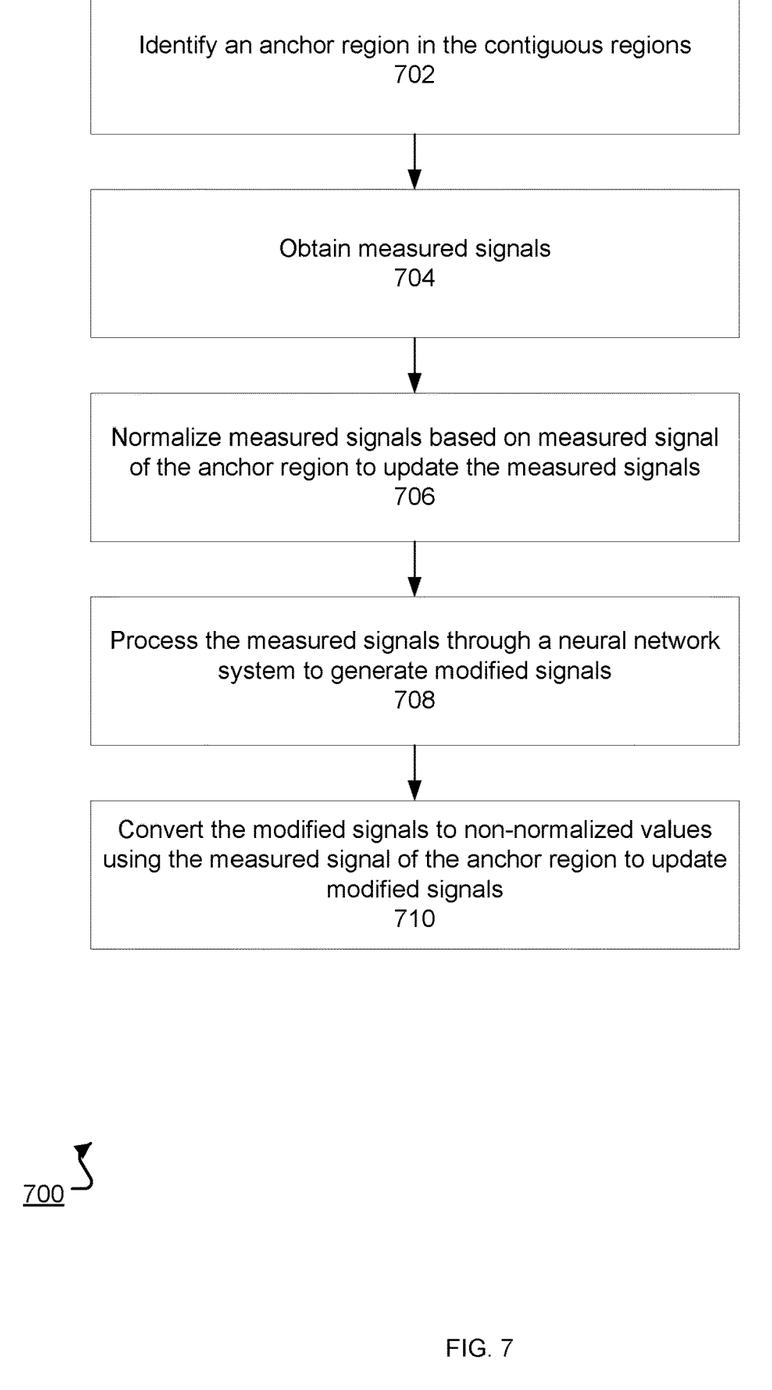
FIG. 7 is a flow diagram of an example process for generating estimated measures of thickness using a neural network.

FIG. 7 is a flow diagram of an example process 700 for generating estimated measures of thickness using a neural network 500. The process 700 can be performed by the polishing apparatus 100.

The polishing apparatus 100 identifies (702) an anchor location of a group of locations of the substrate and obtains (704) measured signals for each location of the group of locations. In some embodiments, the anchor location is spaced away from the edge of the substrate.

The polishing apparatus 100 normalizes (706) each measured signal based on the measured signal of the anchor location, e.g., by dividing each measured signal by the measured signal of the anchor location, to update the measured signals. The polishing apparatus 100 then processes (708) the updated measured signals through the neural network 500 to generate modified signals for each normalized measured signal and converts (710) the modified signals to non-normalized values using the measured signal of the anchor location, e.g., by multiplying each measured signal by the measured signal of the anchor location, to update the measured signals. The polishing apparatus 100 then uses (612) non-normalized modified signals to generate an estimated measure of thickness of each location of the group of locations of the neural network 500.

Figure 8:
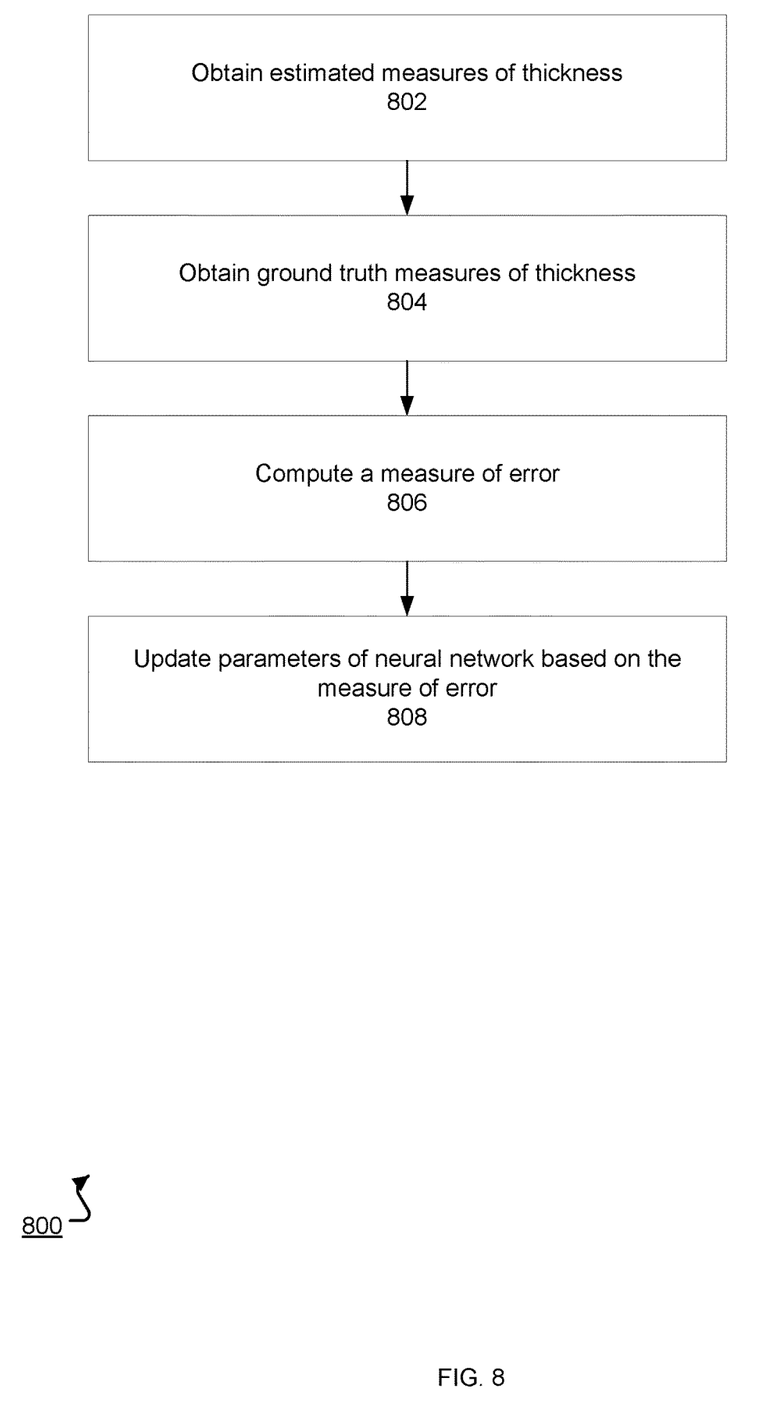
FIG. 8 is a flow diagram of an example process for training a neural network to generate modified signals for a group of measured signals.

FIG. 8 is a flow diagram of an example process 800 for training a neural network 500 to generate modified signals for a group of measured signals. The process 800 can be performed by a system of one or more computers configured to train the neural network 500.

The system obtains (802) estimated measures of thickness generated by the neural network 500 based on input values that include measured signals for each location in a group of locations of the substrate. The system also obtains (804) ground truth measures of thickness for each location in the group of locations. The system can generate ground truth measures of thickness using an electrical impedance measuring method, such as the four-points probe method.

The system computes (806) a measure of error between the estimated measures of thickness and the ground truth measures of thickness and updates one or more parameters of the neural network 500 based on the measure of error. To do so, the system may use a training algorithm that uses gradient descent with backpropagation.

The monitoring system can be used in a variety of polishing systems. Either the polishing pad, or the carrier head, or both can move to provide relative motion between the polishing surface and the substrate. The polishing pad can be a circular (or some other shape) pad secured to the platen, a tape extending between supply and take-up rollers, or a continuous belt. The polishing pad can be affixed on a platen, incrementally advanced over a platen between polishing operations, or driven continuously over the platen during polishing. The pad can be secured to the platen during polishing, or there can be a fluid bearing between the platen and polishing pad during polishing. The polishing pad can be a standard (e.g., polyurethane with or without fillers) rough pad, a soft pad, or a fixed-abrasive pad.

Although the discussion above focuses on an eddy current monitoring system, the correction techniques can be applied to other sorts of monitoring systems, e.g., optical monitoring systems, that scan over an edge of substrate. In addition, although the discussion above focuses on a polishing system, the correction techniques can be applied to other sorts of substrate processing systems, e.g., deposition or etching systems, that include an in-situ monitoring system that scans over an edge of substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A method of polishing a substrate, comprising:
polishing a layer on the substrate at a polishing station;
monitoring the layer during polishing at the polishing station with an in-situ monitoring system to generate a plurality of measured signals for a plurality of different locations on the layer;
generating, for each location of the plurality of different locations, an estimated measure of thickness of the location, the estimated measure of thickness for the location depending on the measured signal for the location and one or more measured signals for one or more other locations, the generating including processing the plurality of measured signals through a neural network, the processing including
inputting the plurality of measured signals for the plurality of different locations into a plurality of corresponding input nodes of the neural network, and
receiving a plurality of outputs corresponding to estimated measures of thickness from a plurality of output nodes of the neural network; and
at least one of detecting a polishing endpoint or modifying a polishing parameter based on each estimated measure of thickness.

2. The method of claim 1, further comprising:
obtaining a second plurality of measured signals for a second plurality of different locations on the layer; and
generating, for each location of the second plurality of different locations, an estimated measure of thickness of the location based on the measured signal for the location, the generating including using a static formula relating multiple values of the measured signals to multiple values of estimated measure of thickness.

3. The method of claim 1, further comprising:
obtaining a third plurality of measured signals for a layer on a second substrate, each of the third plurality of measured signals corresponding to a location of a third plurality of different locations on the layer on the second substrate; and
generating, for each location of the third plurality of different locations, an estimated measure of thickness of the location based on the measured signal for the location, the generating including using a static formula relating multiple values of the measured signals to multiple values of estimated measure of thickness.

4. The method of claim 1, further comprising:
obtaining a ground truth measure of thickness for each location of one or more different locations of the layer;
computing a measure of error between the estimated measure of thickness for each location and the corresponding ground truth measure of thickness for the location; and
updating the parameters of the neural network based on the measure of error.

5. The method of claim 4, wherein the ground truth measure of thickness is determined based on a four-points probes method.

6. A polishing system, comprising:
a carrier to hold a substrate;
a support for a polishing surface;

an in-situ monitoring system having a sensor, the in-situ monitoring system configured to generate measured signals for a plurality of different locations on a layer on the substrate;
a motor to generate relative motion between the sensor and the substrate; and
a controller configured to
receive the measured signals from the in-situ monitoring system,
generate, for each location of the plurality of different locations, an estimated measure of thickness of the location, the estimated measure of thickness for the location depending on the measured signal for the location and one or more measured signals for one or more other locations, the generating including processing the plurality of measured signals through a neural network, the processing through a neural network including
inputting the measured signals for the plurality of different locations into a plurality of corresponding input nodes of the neural network, and
receiving a plurality of outputs corresponding to estimated measures of thickness from a plurality of output nodes of the neural network; and
detect a polishing endpoint, modify a polishing parameter based on each estimated measure of thickness, or both.

7. The polishing system of claim 6, wherein the controller is further configured to generate, for each location of a second plurality of different locations on the layer, an estimated measure of thickness of the location based on the measured signal for the location, the generating including using a static formula relating multiple values of the measured signals to multiple values of estimated measure of thickness.

8. The polishing system of claim 6, wherein the controller is further configured to generate, for each location of the plurality of different locations on a layer on a second substrate, an estimated measure of thickness of the location based on the measured signal for the location, the generating including using a static formula relating multiple values of the measured signals to multiple values of estimated measure of thickness.

9. The polishing system of claim 6, wherein the in-situ monitoring system comprises an eddy current sensor.

10. The polishing system of claim 6, wherein the one or more other locations comprise an anchor location and determining each first measure of thickness comprises normalizing each measured signal based on the measured signal for the anchor location to update the measured signal.

11. The polishing system of claim 10, wherein each estimated measure of thickness is a normalized value and the controller is further configured to convert each estimated measure of thickness to a non-normalized value using the measured signal for the anchor location to update the estimated measure of thickness.

12. A computer storage medium encoded with instructions that, when executed by one or more computers, cause the one or more computers to perform operations comprising:
during polishing of a layer on a substrate at a polishing station, receiving a plurality of measured signals for a plurality of different locations on the layer from an in-situ monitoring system;
generating, for each location of the plurality of different locations, an estimated measure of thickness of the location, the estimated measure of thickness for the location depending on the measured signal for the location and one or more measured signals for one or more other locations, the generating including processing the plurality of measured signals through a neural network, the processing through a neural network including
inputting the plurality of measured signals for the plurality of different locations into a plurality of corresponding input nodes of the neural network, and
receiving a plurality of outputs corresponding to estimated measures of thickness from a plurality of output nodes of the neural network; and
at least one of detecting a polishing endpoint or modifying a polishing parameter based on each estimated measure of thickness.

13. The computer storage medium of claim 12, wherein the operations further comprise:
receiving a second plurality of measured signals for a second plurality of different locations on the layer; and
generating, for each location of the second plurality of different locations, an estimated measure of thickness of the location based on the measured signal for the location, the generating including using a static formula relating multiple values of the measured signals to multiple values of estimated measure of thickness.

14. The computer storage medium of claim 12, wherein the operations further comprise:
receiving a third plurality of measured signals for a layer on a second substrate, each of the third plurality of measured signals corresponding to a location of a third plurality of locations on the layer on the second substrate; and
generating, for each location of the plurality of different locations, an estimated measure of thickness of the location based on the measured signal for the location, the generating including using a static formula relating multiple values of the measured signals to multiple values of estimated measure of thickness.

15. The computer storage medium of claim 12, wherein:
the neural network comprises one or more neural network layers including an input layer, an output layer, and one or more hidden layers;
each neural network layer comprises one or more neural network nodes; and
each neural network node is configured to process an input in accordance with a set of parameters to generate an output.

16. The computer storage medium of claim 15, wherein the input to a neural network node in the input layer includes a measure of the wear of a pad of the polishing station.

17. The computer storage medium of claim 13, wherein the one or more different locations comprise an anchor location and wherein determining each first measure of thickness comprises normalizing each measured signal based on the measured signal for the anchor location to update the measured signal.

18. The computer storage medium of claim 17, wherein each estimated measure of thickness is a normalized value, and wherein the operations further comprise converting each estimated measure of thickness to a non-normalized value using the measured signal for the anchor location to update the estimated measure of thickness.

19. The computer storage medium of claim 12, wherein the operations further comprise:
receiving a ground truth measure of thickness for each location of one or more different locations of the layer;

computing a measure of error between the estimated measure of thickness for each location and the corresponding ground truth measure of thickness for the location; and updating the parameters of the neural network system based on the measure of error.

20. The computer storage medium of claim 19, wherein updating the parameters of the neural network system based on the measure of error comprises backpropagating a gradient of the measure of error through a plurality of layers of the neural network.

* * * * *

UNITED STATES PATENT AND TRADEMARK OFFICE
CERTIFICATE OF CORRECTION

PATENT NO. : 10,994,389 B2
APPLICATION NO. : 15/953203
DATED : May 4, 2021
INVENTOR(S) : Kun Xu et al.

Page 1 of 1

It is certified that error appears in the above-identified patent and that said Letters Patent is hereby corrected as shown below:

In the Claims

Column 15, Line 5, in Claim 19, after "network" delete "system".

Column 15, Line 8, in Claim 20, after "network" delete "system".

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*